(12) United States Patent
Lee

(10) Patent No.: US 7,649,750 B2
(45) Date of Patent: Jan. 19, 2010

(54) LATCH FOR INTERFACE CARD

(75) Inventor: Ching-Yao Lee, Banciao (TW)

(73) Assignee: T-Conn Precision Corporation (TW)

( * ) Notice: Subject to any disclaimer, the term of this patent is extended or adjusted under 35 U.S.C. 154(b) by 0 days.

(21) Appl. No.: 11/855,352

(22) Filed: Sep. 14, 2007

(65) Prior Publication Data

US 2008/0298040 A1   Dec. 4, 2008

(30) Foreign Application Priority Data

May 30, 2007   (TW) .............................. 96119371 A

(51) Int. Cl.
*H05K 7/12* (2006.01)
(52) U.S. Cl. .................. 361/801; 361/759; 361/747; 361/732; 439/326
(58) Field of Classification Search ................ 361/801, 361/759, 747, 740; 439/326, 327
See application file for complete search history.

(56) References Cited

U.S. PATENT DOCUMENTS

| 6,955,554 | B2 * | 10/2005 | Korsunsky et al. | 439/328 |
| 7,004,764 | B2 * | 2/2006 | Boudreau et al. | 439/74 |
| 7,300,298 | B2 * | 11/2007 | Kameda | 439/326 |
| 7,335,032 | B1 * | 2/2008 | Lee et al. | 439/76.1 |

* cited by examiner

*Primary Examiner*—Dameon E Levi
(74) *Attorney, Agent, or Firm*—Ching-Yao Lee; T-Conn Precision Corp.

(57) ABSTRACT

A structure of a latch for an interface card is disclosed. The latch includes a positioning set and a board. The positioning set has a pillar formed at a bottom portion thereof, a protruded frontage with a protruded jointing portion and a connecting portion connected to a limiter, wherein the pillar has a pin positioned at a bottom portion thereof. A first interface card is adapted into the first connector by pressing down the first interface card to be secured by the positioning structure; and a second interface card is adapted into the second connector by pressing down the second interface card to fit the two holes with the jointing portion, and the limiter is covered onto the jointing portion to let the buckling portion of the hole of the limiter support in the hole of the jointing portion to prevent the limiter from coming loose.

6 Claims, 7 Drawing Sheets

LATCH FOR INTERFACE CARD

This application claims the priority benefit of Taiwan patent application serial No. 96119371 filed on May 30, 2007.

BACKGROUND OF THE INVENTION

1. Field of the Invention

The present invention relates to a latch for the interface card applied in the electronic appliances, computer and the electronic devices.

2. Description of Related Art

The advancement of technology has made the electronic device smaller, thinner and lighter with varieties to fit the requirement of the market, and for providing more convenience to the user to carry. The manufacturers have improved the efficiency and the size of the products consistently.

For contenting more operation efficiency in a smaller body with easy assembly of the computer and the electronic device, the specification and the structure of the components have significant modification thereby.

The currently available interface card latch in the market has several positioning styles and structural designs, but the strength of the structure usually is insufficient due to the requirement of size miniaturization, and the miniature structure is not convenient for assembly.

For overcoming the above defects, the present inventors propose a one-piece interface card latch, a grounding structure for the interface card latch, made by the plastic injection process for mass production to reduce the cost, as well as to increase the convenience of assembly and the stability of securing the interface card.

However, the hardware functions and the space in the computer are limited, thus the multilayer interface slot is available to overcome the problem of space limitation, as shown in FIG. 1. The connectors 20 are positioned with raising heights to prevent the interruption occurred at the frontage of the connector 20 to affect receiving the interface cards 30 and 30a.

The present available latch 10 usually has an elastic plate 102 (referring to FIGS. 1 and 2) having buckling blocks 101 on the two distal ends. There is only single layer or the first layer of the interface card 30 can be adapted by the latch 10 corresponding to the connector 20, but the interface card 30a on the upper layer. The latch 10 on the upper layer is limited to the space of the case; therefore, there is presently no suitable structure for it.

SUMMARY OF THE INVENTION

Accordingly, the present inventors provide a structure of a latch with more mobility and suitable for any height of the interface card.

For fitting various requirements of components in the market and reducing the cost, the present inventors created a metallic plate that can be bended to fit the height of the interface card as a latch.

The interface latch of the present invention is a positioning stand that can be able to correspond to the board for positioning various types of interface card with different height.

BRIEF DESCRIPTION OF THE DRAWING

For a more complete understanding of the present invention, reference will now be made to the following detailed description of preferred embodiments taken in conjunction with the following accompanying drawings.

DETAIL DESCRIPTION OF THE EMBODIMENTS

Figure 1:
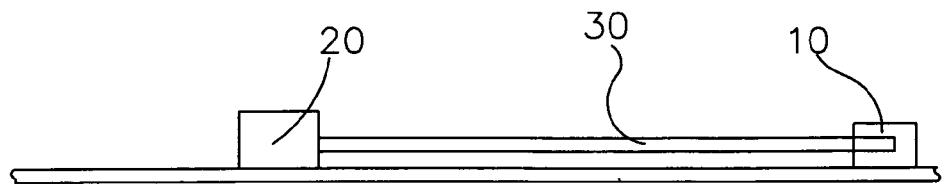
FIG. 1 is a perspective view of a conventional latch.
Figure 2:
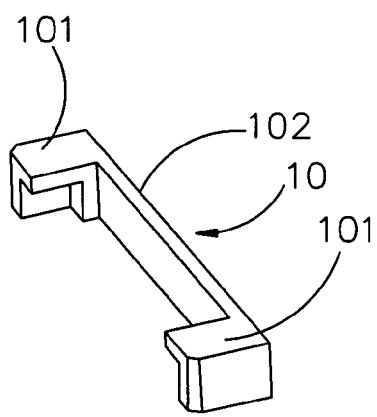
FIG. 2 is an elevational view of a conventional latch.
Figure 3:
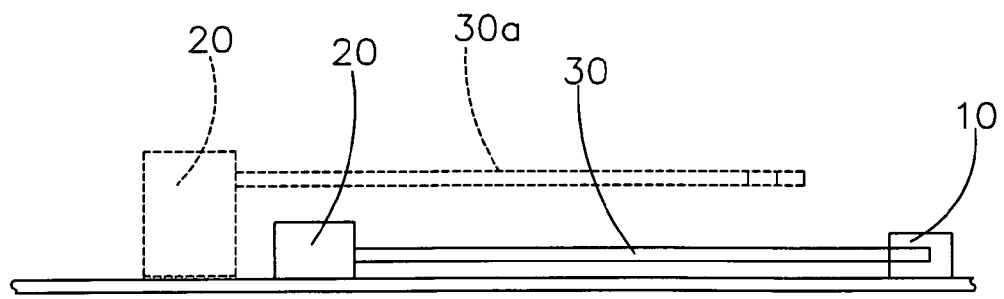
FIG. 3 is a perspective view of an assembly of a multilayer interface card according to an embodiment of the present invention.
Figure 4:
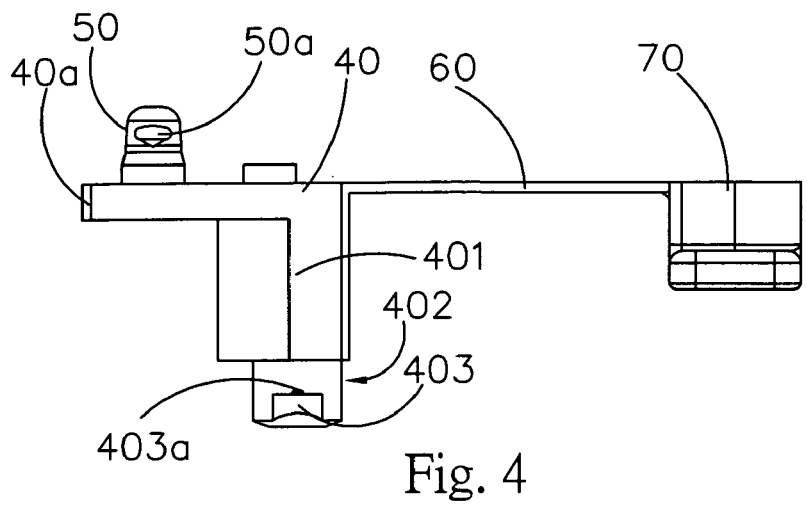
FIG. 4 is a perspective view of two sides of a latch according to the embodiment of the present invention.
Figure 5:
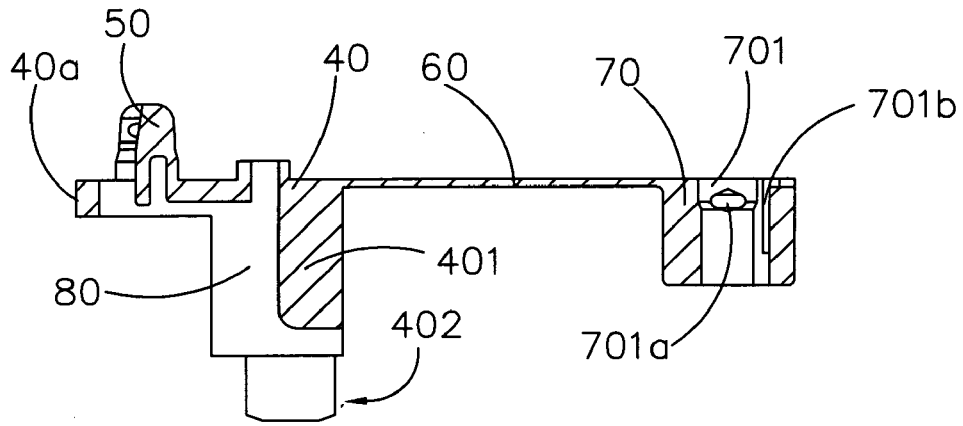
FIG. 5 is a sectional side view of a case according to the embodiment of the present invention.
Figure 6:
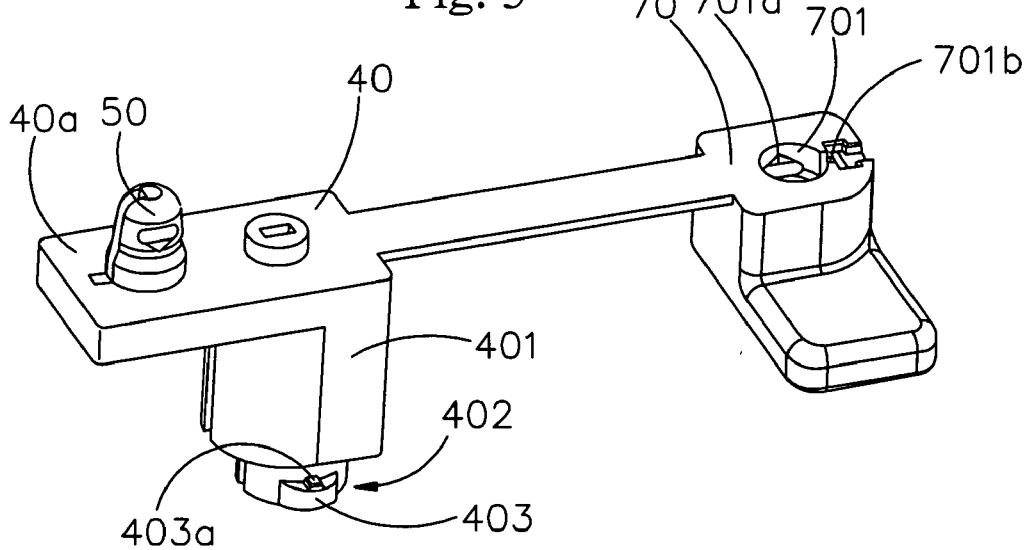
FIG. 6 is an elevational view of a case according to the embodiment of the present invention.
Figure 7:
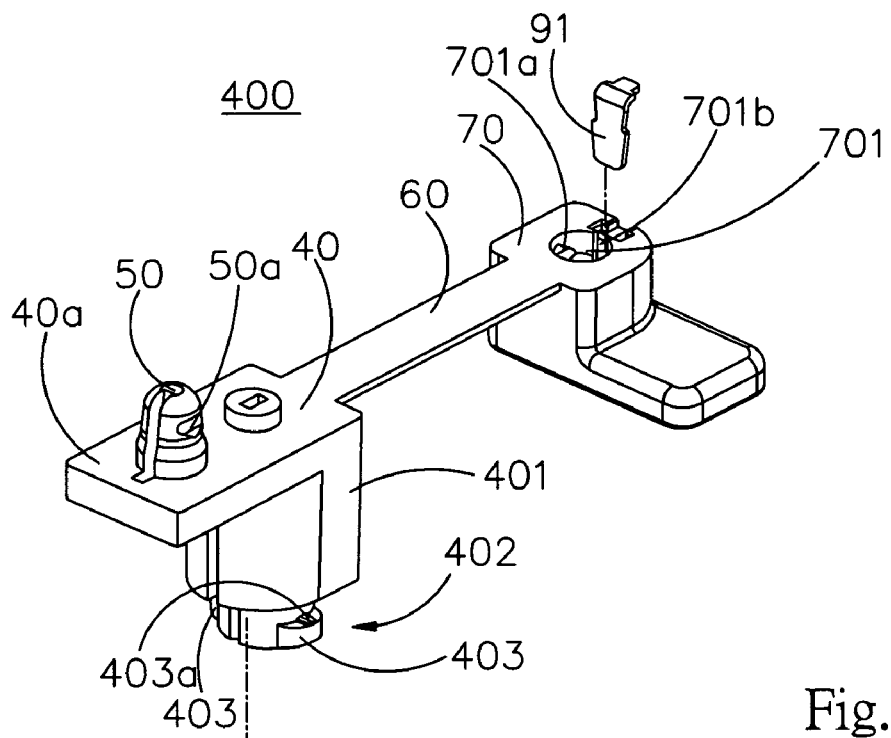
FIG. 7 is an exploded view of a structure of a latch according to an embodiment of the present invention.
Figure 8:
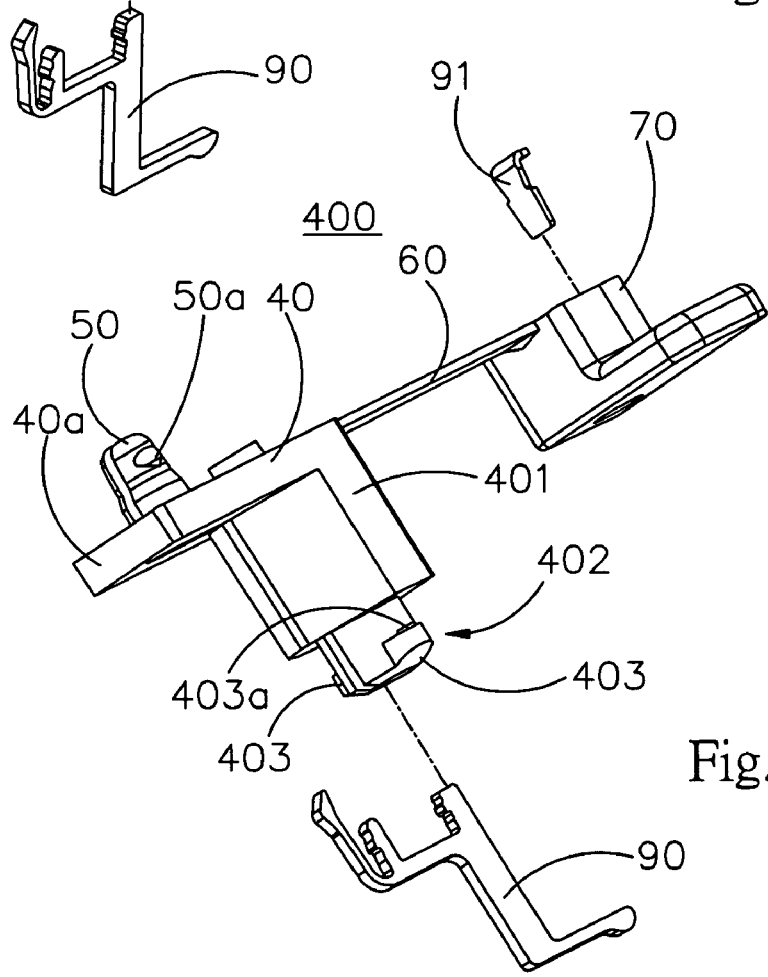
FIG. 8 is another exploded view of a structure of a latch according to an embodiment of the present invention.
Figure 9:
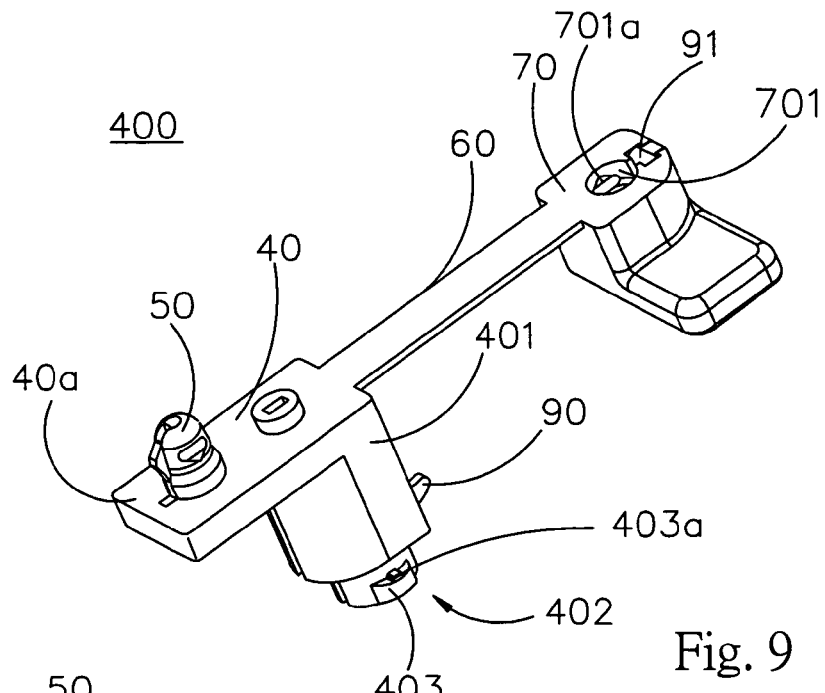
FIG. 9 is an elevational view of a structure of a latch according to an embodiment of the present invention.
Figure 10:
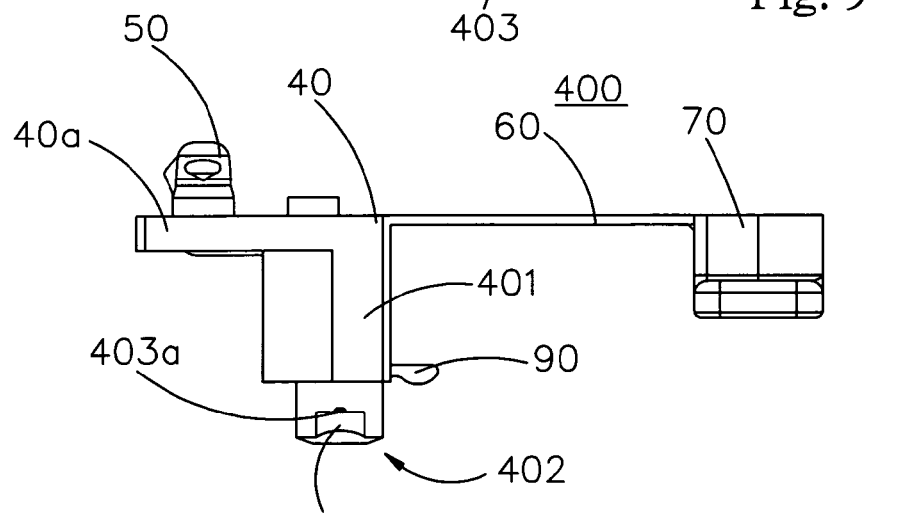
FIG. 10 is a side view of a structure of a latch according to an embodiment of the present invention.
Figure 11:
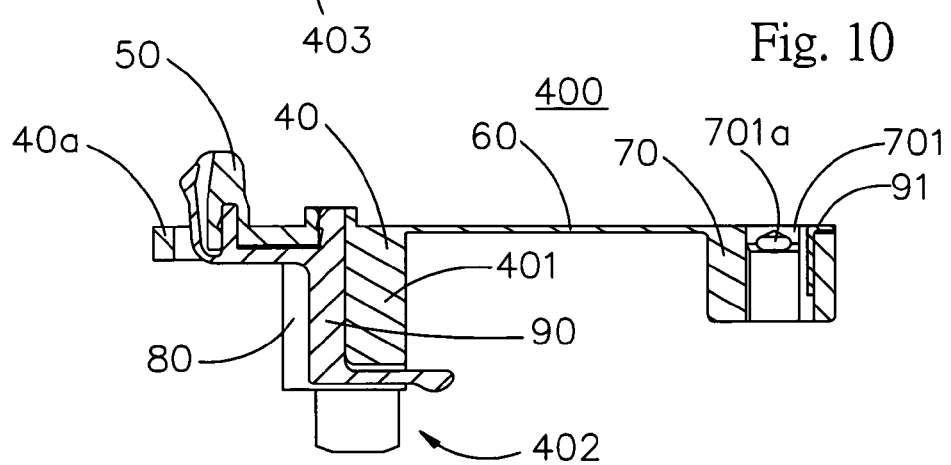
FIG. 11 is a sectional side view of a structure of a latch according to an embodiment of the present invention.

FIGS. 4, 5 and 6, a perspective view, a sectional side view and an elevational view of the case according to an embodiment of the present invention. Referring to FIGS. 4, 5 and 6, the positioning set 40 has a pillar 401 at a bottom portion thereof. The pillar 401 comprises a pin 402 securely positioned at the bottom portion; and the protrusions 403 are position on the two sides thereof, wherein the dimension of the protrusions 403 is smaller than the dimension of the pillar 401. A protruded block 403a is positioned on the top side of the protrusion 403, and the frontage 40a of the positioning set 40 has a jointing portion 50 having a plurality of holes 50a on the flange. The jointing portion 50 of the frontage 40a and the pillar 401 and the pin 402 of the positioning set 40 are positioned non-coaxially with a distance apart. The positioning set 40 has a connection portion 60 connecting with a limiter 70. A terminal slot 80 is formed between the positioning set 40, the frontage 40a, the pin 402 and the jointing portion 50 (as shown in FIG. 7 to 11) for receiving the grounding terminal 90.

The limiter 70 has slot 701 with a plurality of buckling elements 701a and a connected protruded indentation 701b (referring to FIG. 7 to 11) for receiving a grounding plate 91. Thus, the assembly of the latch 400 is completed.

Figure 12:
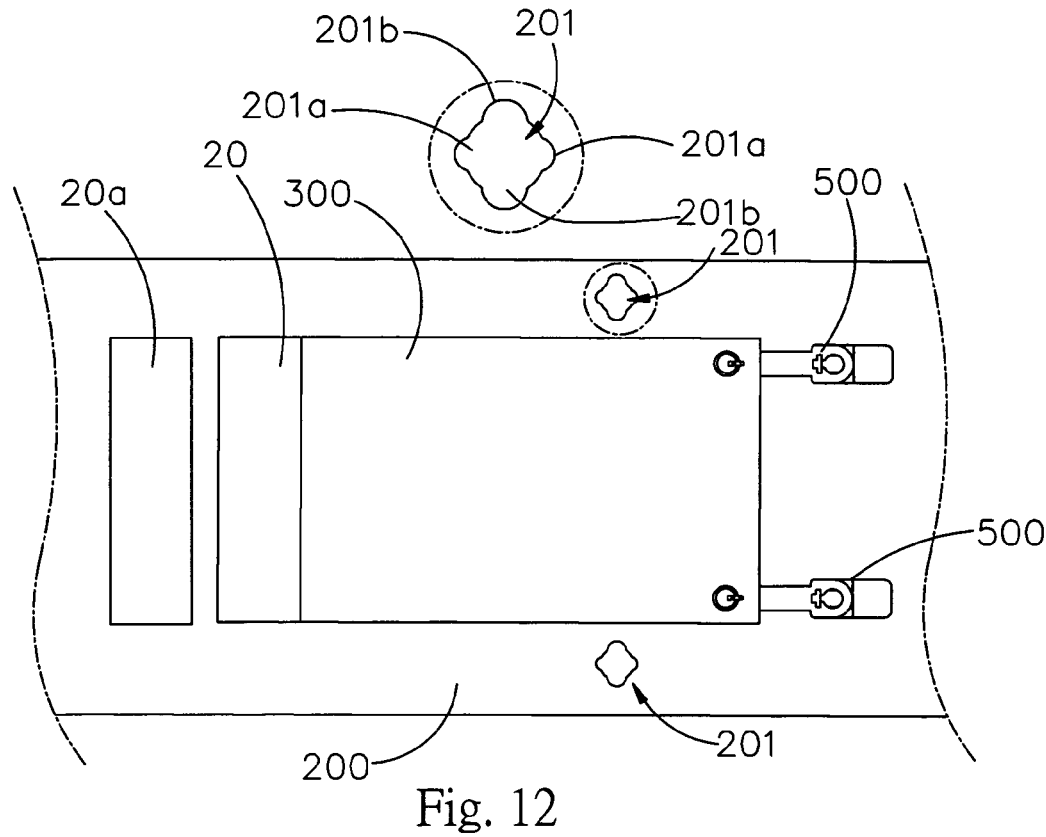
FIG. 12 is a top view of a structure of a latch with an interface card A according to an embodiment of the present invention.
Figure 13:
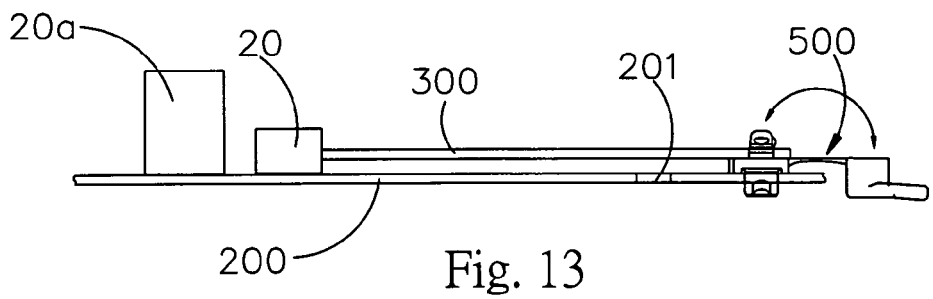
FIG. 13 is a side view of a structure of a latch with an interface card A according to an embodiment of the present invention.
Figure 14:
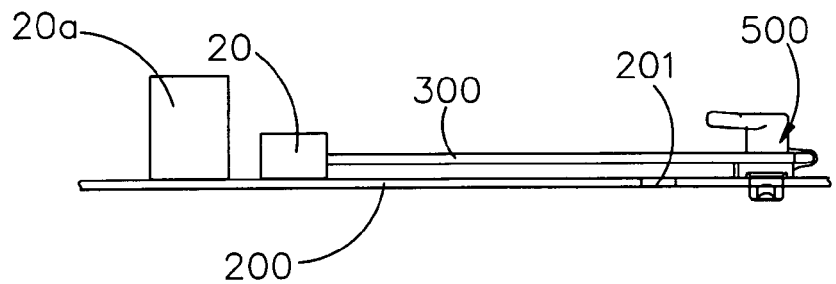
FIG. 14 is a prospective view of a structure of a latch assembled with an interface card A by a positioning element according to an embodiment of the present invention.
Figure 15:
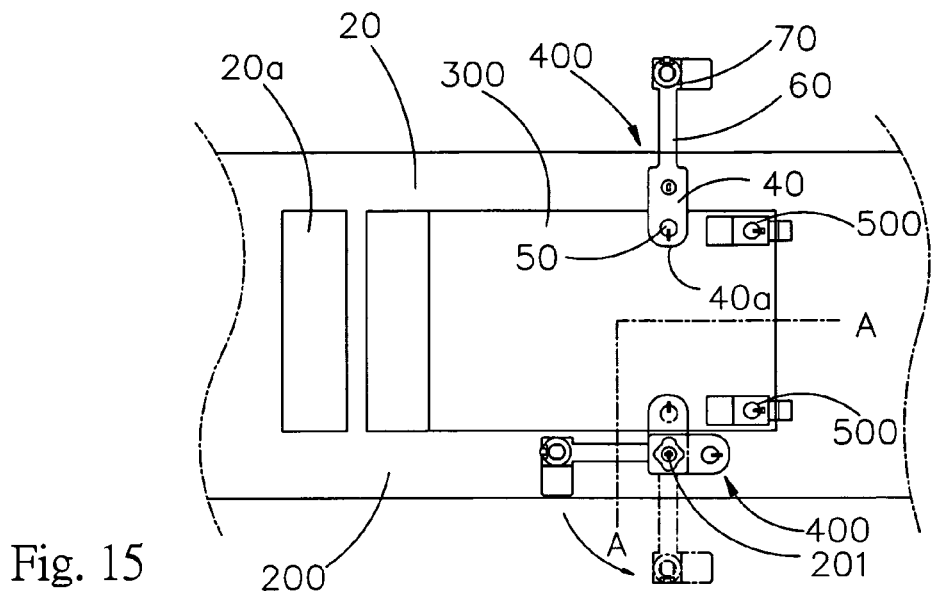
FIG. 15 is a prospective view of screwed assembling of the latch with a board according to an embodiment of the present invention.
Figure 16:
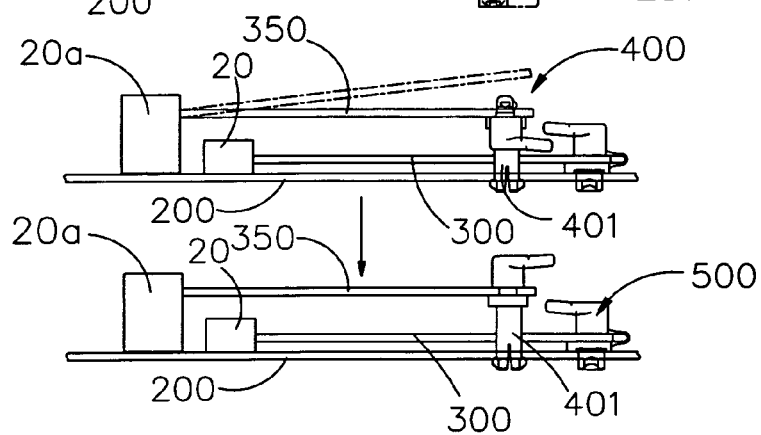
FIG. 16 is a prospective view of adapting an interface card B to a connector B and secured with the latch according to an embodiment of the present invention.
Figure 17:
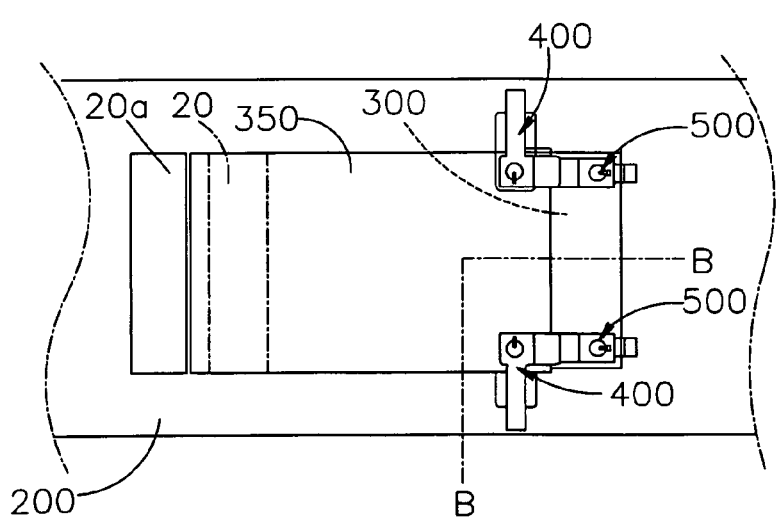
FIG. 17 is a top view of adapting an interface card B to the connector B and secured with the latch according to an embodiment of the present invention.
Figure 18:
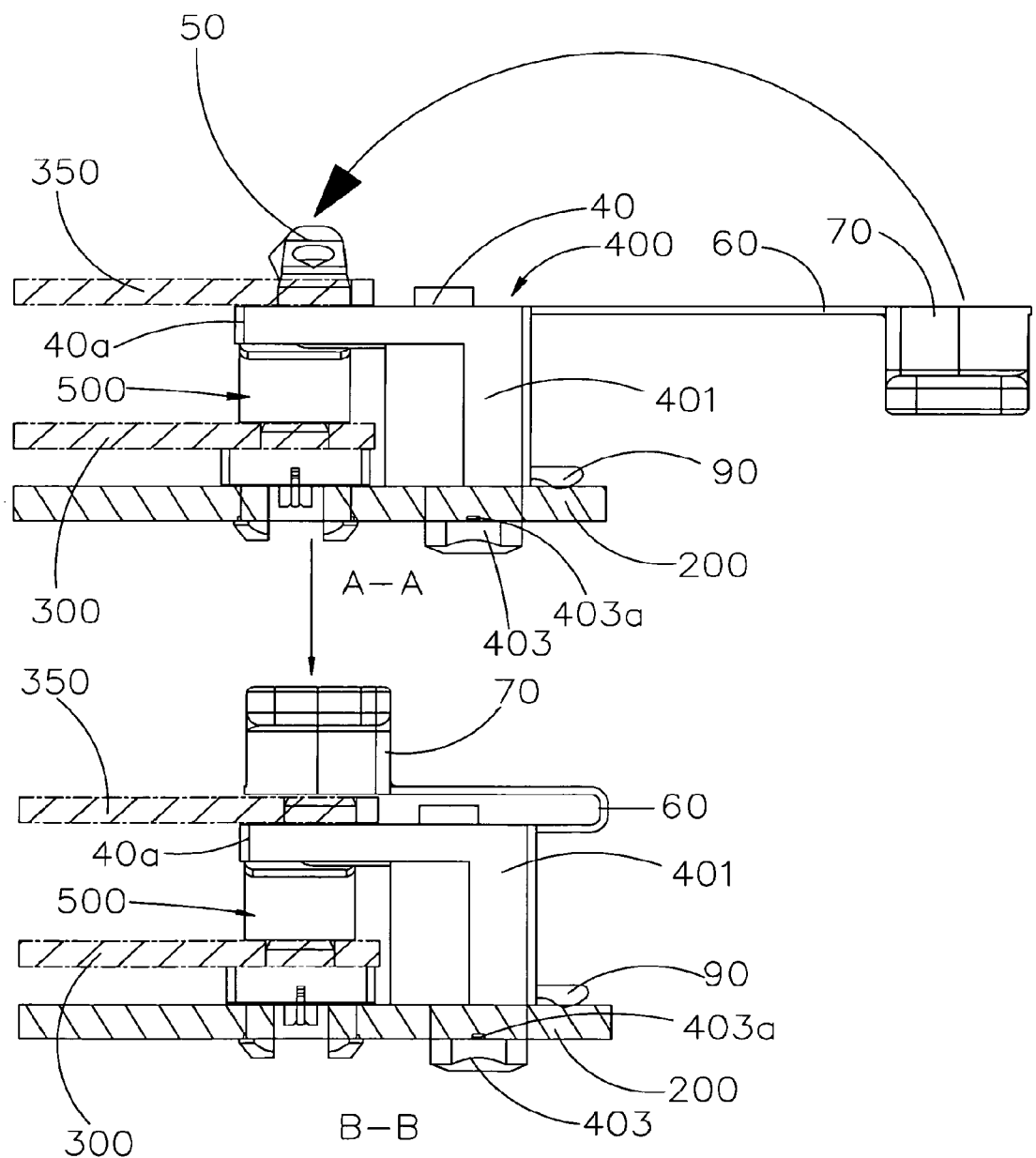
FIG. 18 is a sectional side view of the portion taken along lines A-A and B-B of the embodiment of the present invention.

FIG. 12 is a top view of the structure of a latch with the interface card A according to an embodiment of the present invention. Referring to FIG. 12, the board 200 comprises a connector A 20, a connector B 20a and a positioning structure 500 corresponding to the connector A 20. The board 200b comprises a plurality of holes 201 formed at a proper position, and the hole 201 comprises a plurality of fitting hole 201b and a plurality of buckling hole 201a (as shown in FIG. 12 to 18). An interface card A 300 may be adapted into the connector A 20 and pressed down to be secured by the positioning structure 500, and the pin 402 of the latch 400 may be fitted into the hole 201 of the board 200. The block 403a of the pin 402 accordingly support in the buckling hole 201a of the hole 201 for positioning. The frontage 40a of the positioning set 40 and the jointing portion 50 are positioned above the interface card A 300. Furthermore, the interface card B 350 is adapted into the connector B 20a and pressed down to fit at the two holes with the jointing portion 50, cover the limiter 70 covers onto the jointing portion 50 to let the buckling portion 701a of the hole 701 of the limiter 70 support in the hole 50a of the jointing portion 50 to prevent the limiter 70 from coming loose.

Accordingly to the above description, the pillar 401 and the pin 402 and the bottom of the positioning set 40 of the latch 400 can substantially and flexibly secure the positioning set 40 onto the board 200 with the screwing element, and the frontage 40a and the jointing portion 50 of the positioning set 40 can correspond to the holes of the interface card B 350.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting sense.

What is claimed is:

1. A structure of a latch for an interface card, comprising:
   a positioning set, comprising a pillar at a bottom portion thereof, a protruded frontage with a protruded jointing portion positioned laterally adjacent to the pillar and a connecting portion extending from the protruded frontage and connected to a limiter, wherein the pillar comprises a pin positioned at a bottom portion thereof;
   wherein a first interface card is adapted into a first connector of a board by pressing down the first interface card to be secured by a positioning structure of the board, and the pin of the latch is fitted into a hole of the board; the pin is supported in a buckling hole of the hole for positioning; and
   wherein a second interface card is adapted into a second connector by pressing down the second interface card of the board to fit two holes with the jointing portion, and the limiter is covered onto the jointing portion to let a buckling portion of a hole of the limiter support in a hole of the jointing portion to prevent the limiter from coming loose.

2. The structure of a latch for an interface card according to claim 1, wherein the pin comprises a pillar shape and a protrusion is positioned on two sides thereof, and wherein the protrusion has a dimension smaller than a dimension of the pin and a protruded block is positioned on a top side of the protrusion.

3. The structure of a latch for an interface card according to claim 1, wherein the jointing portion has a plurality of holes on a flange.

4. The structure of a latch for an interface card according to claim 1, wherein the jointing portion of the frontage and the pillar and the pin of the positioning set are positioned non-coaxially with a distance.

5. The structure of a latch for an interface card according to claim 1, wherein a terminal slot is formed between the positioning set, the frontage, the pin and the jointing portion for receiving a grounding terminal.

6. The structure of a latch for an interface card according to claim 1, wherein the limiter comprises a slot with a plurality of buckling elements and a protruded indentation for receiving a grounding plate.

* * * * *